US008686789B2

(12) United States Patent
Jiang et al.

(10) Patent No.: US 8,686,789 B2
(45) Date of Patent: Apr. 1, 2014

(54) TRANSIENT SIGNAL SUPPRESSION FOR A CLASS-D AUDIO AMPLIFIER ARRANGEMENT

(75) Inventors: Xicheng Jiang, Irvine, CA (US); Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/329,699

(22) Filed: Dec. 19, 2011

(65) Prior Publication Data

US 2013/0154736 A1 Jun. 20, 2013

(51) Int. Cl.
*H03F 3/38* (2006.01)
(52) U.S. Cl.
USPC .......................... 330/10; 330/251; 330/207 A
(58) Field of Classification Search
USPC ................. 330/10, 251, 207 A; 375/237, 238
See application file for complete search history.

(56) References Cited

U.S. PATENT DOCUMENTS

2007/0058711 A1 * 3/2007 Risbo ........................... 375/238

* cited by examiner

*Primary Examiner* — Robert Pascal
*Assistant Examiner* — Khiem Nguyen
(74) *Attorney, Agent, or Firm* — Sterne, Kessler, Goldstein & Fox PLLC (57) ABSTRACT

A Class-D amplifier arrangement is disclosed that implements an auxiliary feedback loop and a primary feedback loop. The auxiliary feedback loop operates upon an input signal when the Class-D amplifier arrangement is operating under a power-up condition and a power-down condition so that a modulated signal is confined within the auxiliary feedback loop during the power-up condition and the power-down condition. The confinement of the modulated signal within the auxiliary feedback loop during the power-up condition and the power-down condition diverts transient signals coupled onto the modulated signal from an output device. The primary feedback loop operates upon the input signal when the Class-D amplifier arrangement is operating under a normal condition so that the modulated signal is introduced to the output device during the normal condition.

20 Claims, 4 Drawing Sheets

TRANSIENT SIGNAL SUPPRESSION FOR A CLASS-D AUDIO AMPLIFIER ARRANGEMENT

BACKGROUND OF THE INVENTION

1. Field of Invention

The invention generally relates Class-D audio amplifiers.

2. Related Art

In general, Class-D amplifiers achieve high efficiency and dynamic range. However, they are susceptible to artifact noise, such as pop and click noise, which occurs during amplifier power up and power down. This artifact noise occurs due to the sudden application (during power up) of amplifier DC offset voltage and pulse-width modulation (PWM) pulses to terminals of a speaker to which the amplifier is connected. Similarly, this artifact noise occurs due to the sudden removing (during power down) of amplifier DC offset voltage and the PWM pulses from the speaker terminals. The sudden application and/or removal of the amplifier DC offset voltage and the PWM pulses to the terminals of the speaker generates a transient pulse that discharges through the speaker which causes an undesirable clicking or a pop sound.

Class-D amplifiers are increasingly needed to efficiently drive speakers in mobile communication devices. However in a mobile environment, the amplifier powers up and powers down often. The accompanying pop and click noise therefore limits full adoption of class-D amplifiers in mobile devices. What is needed is a way to suppress pop and click noise in a Class-D amplifier while still preserving its otherwise advantageous characteristics, such as high efficiency and dynamic range.

BRIEF DESCRIPTION OF THE DRAWINGS

The accompanying drawings, which are incorporated in and constitute part of the specification, illustrate embodiments of the invention and, together with the general description given above and the detailed descriptions of embodiments given below, serve to explain the principles of the present invention. In the drawings.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The invention will be better understood from the following descriptions of various "embodiments" of the invention. Specific "embodiments" are implementations of the invention which provide views of the invention, but each embodiment does not itself represent the whole invention. In some cases individual elements from one particular embodiment may be substituted for different elements in another embodiment carrying out a similar or corresponding function. It is expected that those skilled in the art relating to this invention, and with access to the teachings provided herein, will recognize additional modifications, applications, and embodiments within the scope of the invention and additional fields in which the invention would be of significant utility.

Figure 1:
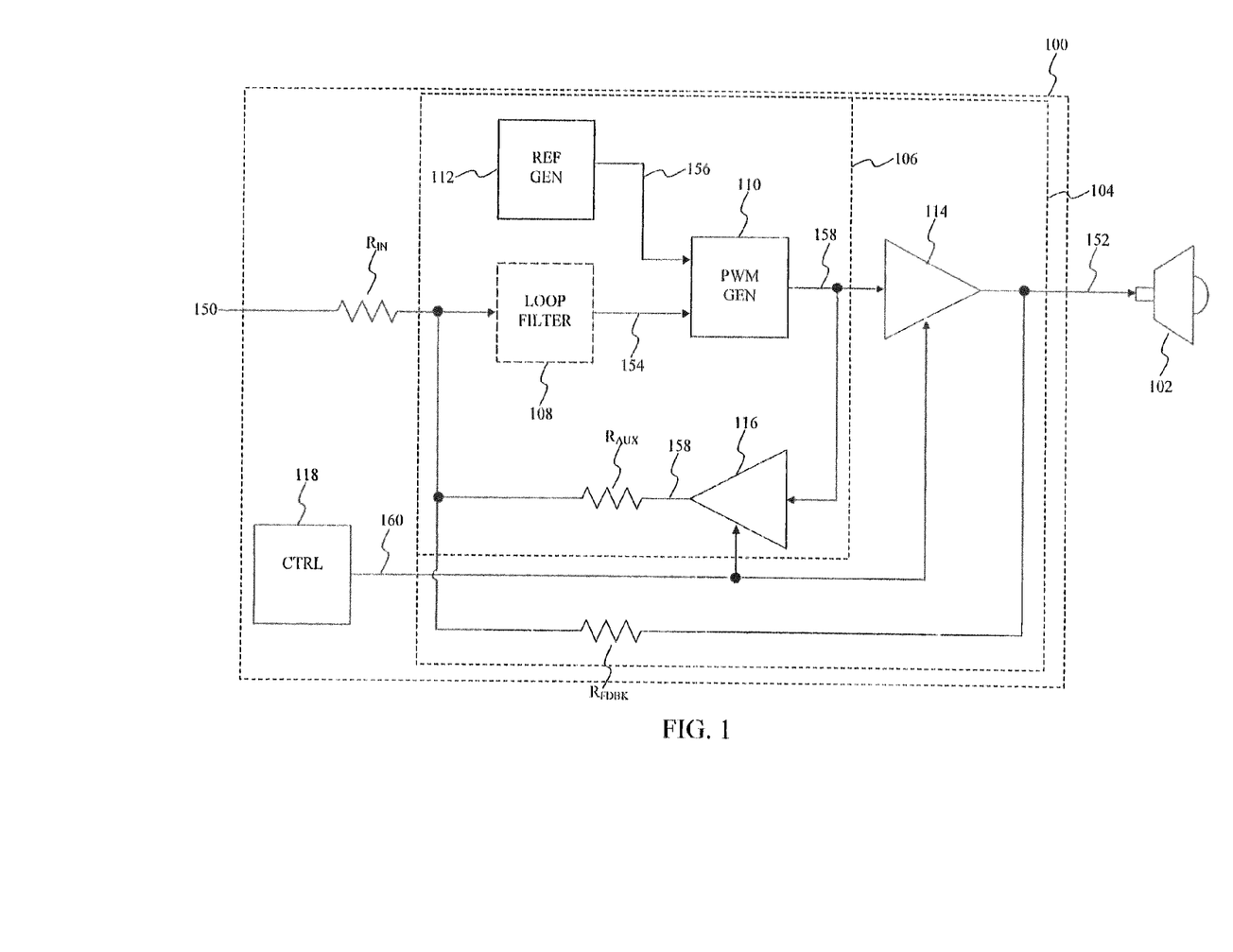
FIG. 1 is a schematic diagram of a Class-D amplifier according to an embodiment of the present invention.

A Class-D amplifier is a specialized type of power amplifier that employs transistors that are configured and arranged in a push-pull configuration and driven to act as a switch. Typically, artifact noise, such as pop and click noise to provide an example, occurs during power up and power down of the Class-D amplifier. This artifact noise typically results from undesired transients in the Class-D amplifier which can produce audible pops and clicks when the Class-D amplifier is coupled to a speaker. Most often, the undesired transients can be generated when the Class-D amplifier changes its operating mode, such as power up/power down to provide an example. During these mode changes, abrupt stopping and starting of various components with the Class-D amplifier can lead to the undesired transients. For example, during normal operation, a loop filter, such as optional loop filter 108 as shown in FIG. 1 to provide an example, can generate an unwanted DC offset within the Class-D amplifier. However, during power up of the Class-D amplifier, the loop filter suddenly generates this unwanted DC offset which causes a first undesired transient within the Class-D amplifier. Similarly, during power down of the Class-D amplifier, this unwanted DC offset is suddenly removed from the Class-D amplifier which causes a second undesired transient within the Class-D amplifier. The first and second undesired transient can produce audible pops and clicks when the Class-D amplifier is coupled to a speaker. Pops and can clicks may also be generated when PWM pulses suddenly start and/or stop.

The present invention reduces undesired transients in a Class-D amplifier, especially during power up and/or power down, to substantially reduce or suppress artifact noise, such as the pop and click noise, within the Class-D amplifier while still preserving its otherwise advantageous characteristics, such as high efficiency and dynamic range.

FIG. 1 is a schematic diagram of a Class-D amplifier according to an embodiment of the present invention. A Class-D amplifier 100 amplifies an input signal 150 to provide a primary output signal 152 for presentation to a speaker 102. However, the speaker 102 as shown in FIG. 1 is for illustrative purposes only, those skilled in the relevant art(s) will recognize that the Class-D amplifier 100 may be coupled to other devices without departing from the spirit and scope of the present invention. Instead of presenting undesired transients to the speaker 102 during power up and/or power down which can cause audible pops and clicks as discussed above, the Class-D amplifier 100 diverts these undesired transients from being presented to the speaker 102. As shown in FIG. 1, the Class-D amplifier 100 includes a primary feedback loop 104 and an auxiliary feedback loop 106. The primary feedback loop 104 operates in conjunction with the auxiliary feedback loop 106 to divert undesired transients from being presented to the speaker 102 during power up and/or power down.

The primary feedback loop 104 includes an optional loop filter 108, a pulse width modulation (PWM) generator 110, a reference generator 112, and a power driver 114. The optional loop filter 108 receives the input signal 150 via an input resistance $R_{IN}$. Often, the input signal 150 represents an audio signal having a frequency range from approximately 20 Hz to approximately 20 kHz; however, those skilled in the relevant art(s) will recognize that other types of signals are possible for the input signal 150 without departing from the spirit and scope of the present invention. Typically, the optional loop filter 108 is used for maintaining loop dynamics, also referred to as stability, for the optional loop filter 108. The optional loop filter 108 can additionally reduce unwanted noise within the primary feedback loop 104 to provide a filtered signal 154.

The PWM generator 110 pulse width modulates the input signal 150 or, optionally, the filtered signal 154, in accordance with a reference signal 156. Typically, the PWM generator 110 provides a modulated signal 158 at a first logic level, such as a logic one to provide an example, when the input signal 150 or, optionally, the filtered signal 154, is greater than or equal to the reference signal 156. Similarly, the PWM generator 110 provides the modulated signal 158 at a second logic level, such as a logic zero to provide an example, when the input signal 150 or, optionally, the filtered signal 154, is less than the reference signal 156.

The power driver 114 amplifies the modulated signal 158 in accordance with a programmable gain to provide the primary output signal 152. As to be discussed below, the programmable gain may be smoothly ramped up from a minimum programmable gain to a maximum programmable gain and/or smoothly ramped down from the maximum programmable gain to the minimum programmable gain. Typically, the primary output signal 152 is provided to the speaker 102. The speaker 102 may be characterized as having an inductive impedance and some parasitic capacitance which together operate to filter the primary output signal 152 to be an amplified representation of the input signal 150. The primary feedback loop 104 additionally includes a resistor $R_{FDBK}$ that, in conjunction with the input resistance $R_{IN}$ and/or the programmable gain, determines a gain of the primary feedback loop 104.

The reference generator 112 provides the reference signal 156 to the PWM generator 110. In an exemplary embodiment, the reference generator 112 provides a ramp signal as the reference signal 156. However, those skilled in the relevant art(s) will recognize that the reference generator 112 may provide other types of signals to the PWM generator 110 without departing from the spirit and scope of present invention. Typically, the reference signal 156, as well as these other types of signals, are characterized as having a frequency that is greater, such as twice the Nyquist rate to provide an example, than a frequency of the input signal 150.

The auxiliary feedback loop 106 includes the optional loop filter 108, the PWM generator 110, the reference generator 112, and an auxiliary driver 116. The optional loop filter 108 and the PWM generator 110 operate upon the input signal 150 to provide the modulated signal 158 in a substantially similar manner as described above. The auxiliary driver 116 amplifies the modulated signal 158 in accordance with a programmable gain to provide an auxiliary output signal 158. As to be discussed below, the programmable gain may be smoothly ramped up from a minimum programmable gain to a maximum programmable gain and/or smoothly ramped down from the maximum programmable gain to the minimum programmable gain. In an exemplary embodiment, the programmable gain of the auxiliary driver 116 is inversely related to the programmable gain of the power driver 114. In this exemplary embodiment, the programmable gain of the auxiliary driver 116 smoothly ramps up as the programmable gain of the power driver 114 smoothly ramps down and/or the programmable gain of the auxiliary driver 116 smoothly ramps down as the programmable gain of the power driver 114 smoothly ramps up. The auxiliary feedback loop 106 additionally includes a resistor $R_{AUX}$ that, in conjunction with the input resistance $R_{IN}$ and the programmable gain, determines a gain of the auxiliary feedback loop 106. Typically, a maximum programmable gain of the auxiliary driver 116 is a small fraction of a maximum programmable gain of the power driver 114.

A controller module 118 controls overall operation of the Class-D amplifier 100. The controller module 118 provides a gain control 160 to control the programmable gains of the power driver 114 and the auxiliary driver 116. At the beginning of power up of the Class-D amplifier 100, the programmable gain of the power driver 114 is minimized and the programmable gain of the auxiliary driver 116 is maximized. This causes the input signal 150 to be entirely operated upon by the auxiliary feedback loop 106. As a result, any undesired transients that may result from powering up the Class-D amplifier 100 are diverted away from the power driver 114 and passed onto the auxiliary driver 116. The programmable gain of the power driver 114 is gradually increased from its minimum value to its maximum value while the programmable gain of auxiliary driver 116 is gradually decreased from its maximum value to its minimum value. In an exemplary embodiment, the auxiliary driver 116 may be characterized as being an open circuit when the programmable gain is at its minimum value. Once the primary feedback loop 104 and/or the auxiliary feedback loop 106 have settled, namely are free from undesirable transients, the input signal 150 is effectively handed off from the auxiliary feedback loop 106 to the primary feedback loop 104. Typically, the handoff occurs once common components between the primary feedback loop 104 and the auxiliary feedback loop 106, such as the optional loop filter 108 and the PWM generator 110 to provide some examples, have settled.

During normal operation, the programmable gain of the power driver 114 is at its maximum value while the programmable gain of auxiliary driver 116 is at its minimum value. This causes the input signal 150 to be entirely operated upon by the primary feedback loop 104.

At the beginning of power down of the Class-D amplifier 100, the programmable gain of the power driver 114 is maximized and the programmable gain of the auxiliary driver 116 is minimized. The programmable gain of the power driver 114 is gradually decreased from its maximum value to its minimum value while the programmable gain of auxiliary driver 116 is gradually increased from its minimum value to its maximum value. In an exemplary embodiment, the power driver 114 may be characterized as being an open circuit when the programmable gain is at its minimum value. Once the primary feedback loop 104 and/or the auxiliary feedback loop 106 have settled, namely are free from undesirable transients, the input signal 150 is effectively handed off from the primary feedback loop 104 to the auxiliary feedback loop 106. Typically, the handoff occurs once common components between the primary feedback loop 104 and the auxiliary feedback loop 106, such as the optional loop filter 108 and the PWM generator 110 to provide some examples, have settled. As a result, any undesired transients that may result from powering down the Class-D amplifier 100 are diverted away from the power driver 114 and passed onto the auxiliary driver 116. The input signal 150 is effectively smoothly handed-off from the primary feedback loop 104 to the auxiliary feedback loop 106 by this ramping of their respective programmable gains.

Figure 2:
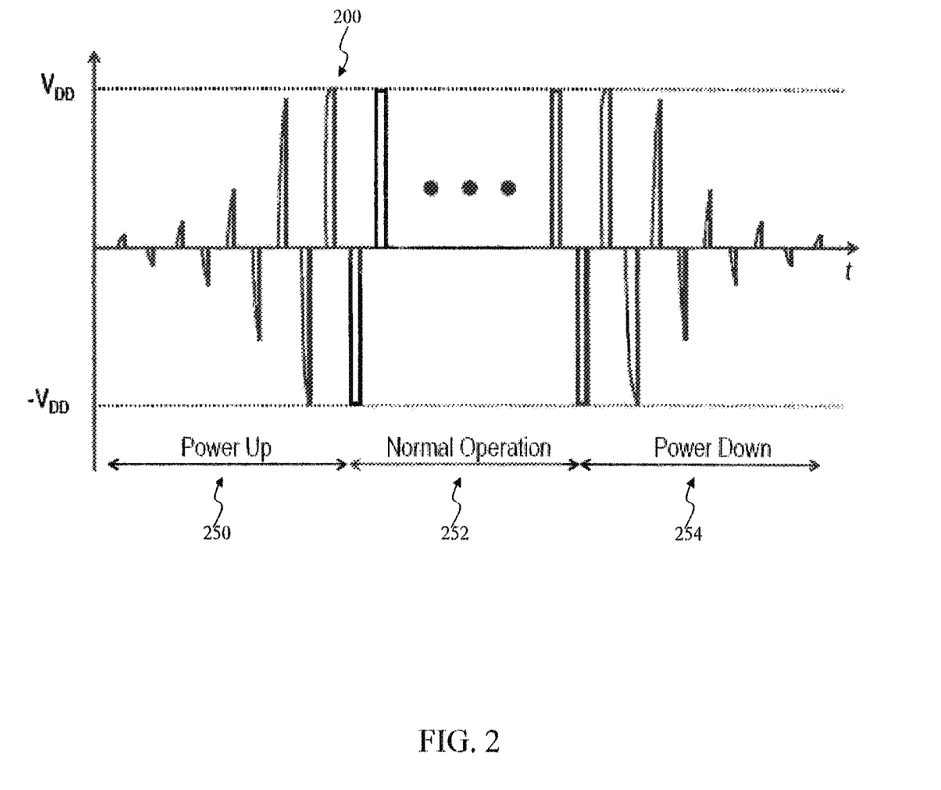
FIG. 2 illustrates an exemplary modulated signal to illustrate the powering up and powering down of the Class-D amplifier according to an exemplary embodiment of the present invention.

FIG. 2 illustrates an exemplary modulated signal to illustrate the powering up and powering down of the Class-D amplifier according to an exemplary embodiment of the present invention. As discussed above, a Class-D amplifier, such as the Class-D amplifier 100 to provide an example, can operate in a power up mode of operation 250, a normal mode of operation 252, and a power down mode of operation 254. In the power up mode of operation 252, a programmable gain of a primary feedback loop, such as the primary feedback loop 104 to provide an example is at its minimum value and a programmable gain of an auxiliary feedback loop, such as the auxiliary feedback loop 106 to provide an example is at its maximum value. The programmable gain of the primary feedback loop is gradually increased from its minimum value to its maximum value while the programmable gain of the auxiliary feedback loop is gradually decreased from its maximum value to its minimum value.

From the discussion above, the primary feedback loop amplifies an input signal, such as the input signal 150 to provide an example, using from a modulated signal 200, such as the modulated signal 158 to provide an example. As shown in FIG. 2, the auxiliary feedback loop draws power from the modulated signal 250 during the power up mode of operation 250. This power draw is the largest when the programmable gain of the auxiliary feedback loop is at its maximum value and gradually decreases as the programmable gain of the auxiliary feedback loop is gradually decreased to its minimum value. As a result, the modulated signal 250 itself gradually increases from its minimum value corresponding to the auxiliary feedback loop being at its maximum value to its maximum value corresponding to the auxiliary feedback loop being at its minimum value. This gradual increasing of the modulated signal 250 leads to a gradual increase in an output signal, such as the primary output signal 152 to provide an example, of the primary feedback loop.

When the programmable gain of the primary feedback loop is at its maximum value and/or the programmable gain of the auxiliary feedback loop is at its minimum value, the Class-D amplifier may be characterized as being in the normal mode of operation 252.

In the power down mode of operation 254, the programmable gain of the primary feedback loop is at its maximum value and the programmable gain of the auxiliary feedback loop is at its minimum value. The programmable gain of the primary feedback loop is gradually decreased from its maximum value to its minimum value while the programmable gain of the auxiliary feedback loop is gradually increased from its minimum value to its maximum value.

As additionally shown in FIG. 2, the auxiliary feedback loop begins to draw power from the modulated signal 250 during the power down mode of operation 252. This power draw is the largest when the programmable gain of the auxiliary feedback loop is at its maximum value and gradually decreases as the programmable gain of the auxiliary feedback loop is gradually decreased to its minimum value. As a result, the modulated signal 250 itself gradually decreases from its maximum value corresponding to the auxiliary feedback loop being at its minimum value to its minimum value corresponding to the auxiliary feedback loop being at its maximum value. This gradual decreasing of the modulated signal 250 leads to a gradual decrease in the output signal of the primary feedback loop.

Figure 3:
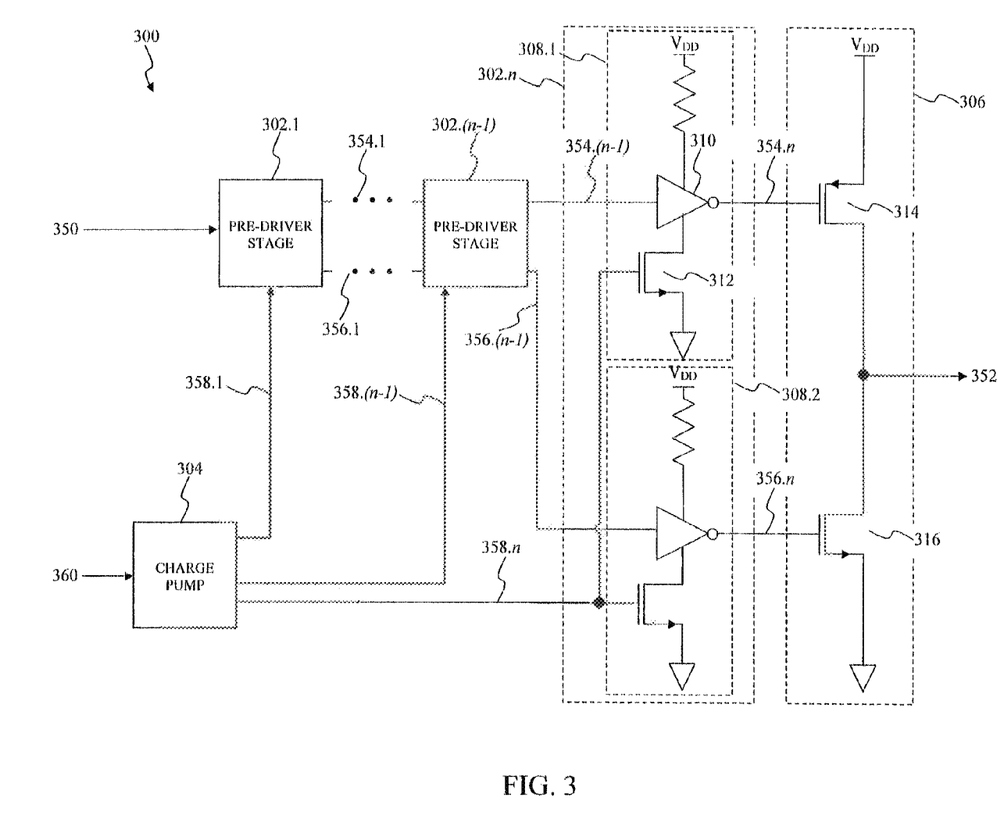
FIG. 3 illustrates an exemplary embodiment of a power driver that can be used as part of the Class-D amplifier according to an embodiment of the present invention.

FIG. 3 illustrates an exemplary embodiment of a power driver that can be used as part of the Class-D amplifier according to an embodiment of the present invention. A power driver 300 amplifies an input signal 350 to provide an output signal 352. The power driver 300 may represent an exemplary embodiment of the power driver 114. As such, the input signal 350 and the output signal 352 may represent exemplary embodiments of the modulated signal 158 and the primary output signal 152, respectively. The power driver 300 includes pre-driver stages 302.1 through 302.n, a charge pump 304, and an output stage 306.

The pre-driver stages 302.1 through 302.n amplify their respective input signals to provide respective output signals 354.1 through 354.n and output signals 356.1 through 356.n. Those skilled in the relevant art(s) will recognize that the pre-driver stages 302.1 through 302.n may include a single pre-driver stage or multiple pre-driver stages without departing from the spirit and scope of the present invention. A first pre-driver stage from among the pre-driver stages 302.1 through 302.n amplifies the input signal 350 to provide output signals 354.1 and 356.1. A next pre-driver stage from among the pre-driver stages 302.1 through 302.n amplifies output signals from a previous pre-driver stage from among the pre-driver stages 302.1 through 302.n.

In an exemplary embodiment, the pre-driver stages 302.1 through 302.n are implemented in a substantially similar manner; therefore, only the pre-driver stage 302.n is to be discussed in further detail. The pre-driver stage 302.n includes a first stage 308.1 and a second stage 308.2 to amplify the output signals 354.(n−1) and 356.(n−1), respectively, to provide the output signals 354.n and 356.n, respectively. The first stage 308.1 is substantially similar to the second stage 308.2; therefore, only the first stage 308.1 is to be discussed in further detail. The first stage 308.1 includes an amplifier 310, such as a CMOS inverting amplifier to provide an example though any suitable amplifier may be used that will be apparent to those skilled in the relevant art(s) without departing from the spirit and scope of the present invention, and a switching transistor 312. The amplifier 310 amplifies the output signal 354.(n−1) in response to a state of the switching transistor 312. The switching transistor 312 can be in a conducting or "on" state or in a non-conducting or "off" state depending upon a corresponding amplifier control signal from among amplifier control signals 358.1 through 358.n. For example, the amplifier 310 amplifies the output signal 354.(n−1) when the switching transistor 312 is in the conducting or "on" state and does not amplify the output signal 354.(n−1) when the switching transistor 312 is in the non-conducting or "off" state.

The charge pump 304 provides the amplifier control signals 358.1 through 358.n to the pre-driver stages 302.1 through 302.n in response to a gain control 360, such as the gain control 160 to provide an example. The amplifier control signals 358.1 through 358.n gradually increase and/or decreases programmable gains of the pre-driver stages 302.1 through 302.n. For example, the amplifier control signals 358.1 through 358.n gradually transition switching transistors of the pre-driver stages 302.1 through 302.n to transition from the "on" state or to the "off" state and/or from the "off" state to the "on" state.

The output stage 306 includes a p-type switching transistor 314 and an n-type switching transistor 316. The p-type switching transistor 314 and the n-type switching transistor 316 typically represent complementary transistors whereby only the p-type switching transistor 314 and the n-type switching transistor 316 is conducting at a given instance in time. For example, when the output signal 354.n causes the p-type switching transistor 314 to conduct, the output signal 352 is coupled to a first logic level that can be represented by a first potential $V_{DD}$. In this example, the n-type switching transistor 316 is not conducting when the p-type switching transistor 314 is conducting. As another example, when the output signal 356.n causes the n-type switching transistor 316 to conduct, the output signal 352 is coupled to a second logic level that can be represented by a second potential, such as a ground potential to provide an example. In this other example, the p-type switching transistor 314 is not conducting when the n-type switching transistor 316 is conducting. Typically, the output stage 306 may be characterized as being a half H-bridge stage that is coupled to a first coupling of a speaker, such as the speaker 102 to provide an example. Although not shown in FIG. 3, another half H-bridge stage that is substantially similar to the output stage 306 may be included within the power driver 300 to couple to a second coupling of the speaker.

Figure 4:
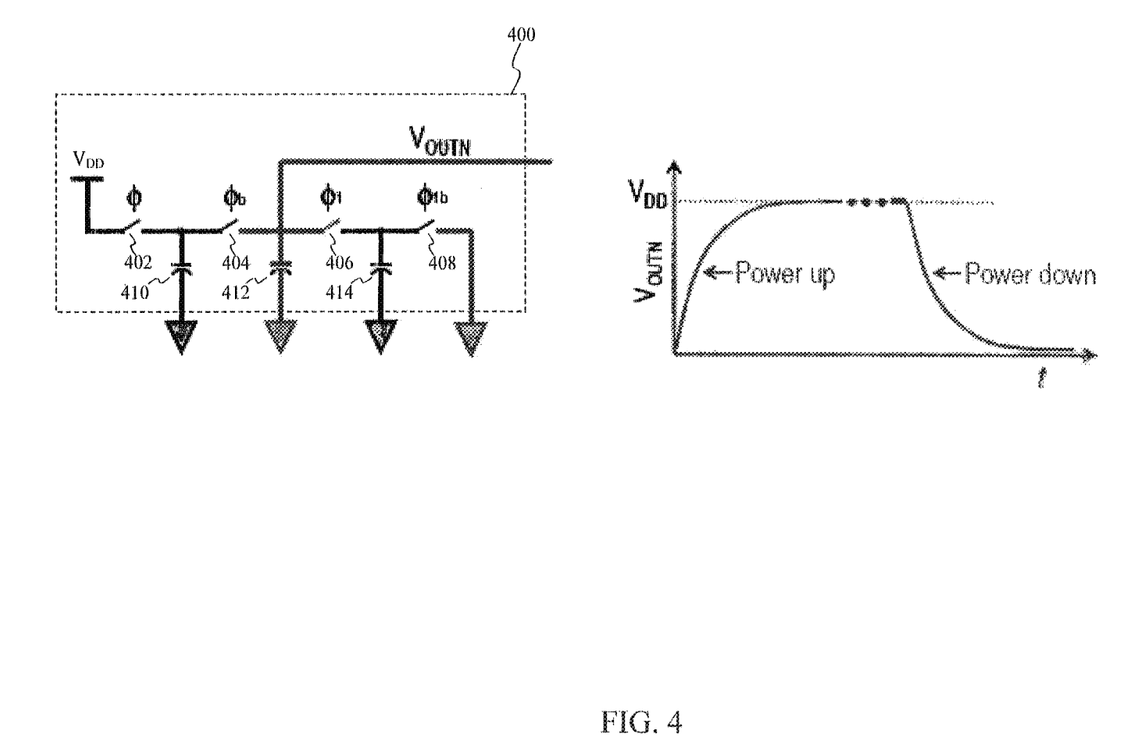
FIG. 4 illustrates an exemplary embodiment of a charge pump and its corresponding output that can be used as part of the Class-D amplifier according to an embodiment of the present invention.

FIG. 4 illustrates an exemplary embodiment of a charge pump and its corresponding output that can be used as part of the Class-D amplifier according to an embodiment of the present invention. A charge pump 400 provides a control signal $V_{OUTN}$ which can gradually increase and/or decreases programmable gains of programmable amplifiers, such as the pre-driver stages 302.1 through 302.n to provide an example. The charge pump 400 may represent an exemplary embodiment of the charge pump 304.

The charge pump 400 includes switches 402 through 408 and capacitors 410 through 414. The switches 402 through 404 charge and/or discharge the capacitors 410 through 414 in response to a clock signal to provide an. The clock signal may represent an exemplary embodiment of the gain control 360.

The clock signal includes clock signals $\phi$, $\phi b$, $\phi 1$, and $\phi 1b$. A pumping up mode of operation for the charge pump occurs when the clock signals $\phi$, $\phi b$, $\phi 1$, and $\phi 1b$ cause the switches 402 through 404 to charge the capacitors 410 through 414. The charging of the capacitors in this manner produces a gradual increase in the output $V_{OUTN}$ from its minimum value to its maximum value. A pumping down mode of operation occurs when the clock signals $\phi$, $\phi b$, $\phi 1$, and $\phi 1b$ cause the switches 402 through 404 to discharge the capacitors 410 through 414. The charging of the capacitors in this manner produces a gradual decrease in the output $V_{OUTN}$ from its maximum value to its minimum value.

For example, the amplifier control signals 358.1 through 358.n gradually transition switching transistors of the pre-driver stages 302.1 through 302.n to transition from the "on" state or to the "off" state and/or from the "off" state to the "on" state.

CONCLUSION

The invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Various embodiments of the present invention have been described above. It should be understood that they have been presented by way of example only, and not limitation. It will be apparent to persons skilled in the relevant art that various changes in form and detail can be made from those specifically described without departing from the spirit and scope of the invention. Thus, the breadth and scope of the present invention should not be limited by any of the above-described exemplary embodiments.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. The breadth and scope of the present invention should not be limited by any of the above-described exemplary embodiments.

What is claimed is:

1. An amplifier system, comprising:
an auxiliary feedback loop configured to operate upon an input signal if the amplifier system is operating under a power-up condition or a power-down condition, wherein a modulated signal is confined within the auxiliary feedback loop during the power-up condition or the power-down condition so that a plurality of transient signals coupled on the modulated signal are diverted away from an output device, and wherein the auxiliary feedback loop comprises:
an auxiliary driver, wherein the auxiliary driver is configured to:
operate at a first gain if the amplifier system is operating under the power-up condition or the power-down condition, and
operate at a second gain if the amplifier system is operating under a normal condition, wherein the second gain is lower than the first gain; and
a primary feedback loop configured to operate upon the input signal if the amplifier system is operating under the normal condition, wherein the modulated signal is introduced to the output device during the normal condition.

2. The amplifier system of claim 1, wherein the primary feedback loop comprises:
a power driver, wherein the power driver is configured to:
operate at the second gain if the amplifier system is operating under the power-up condition or the power-down condition, and
operate at the first gain if the amplifier system is operating under the normal condition.

3. The amplifier system of claim 2, wherein the power driver is further configured to:

operate as an open circuit if the power driver is operating at the second gain to divert the modulated signal from reaching the output device, thereby preventing the plurality of transient signals from reaching the output device; and allow the primary feedback loop to operate on the input signal if the power driver is operating at the first gain to introduce the modulated signal to the output device.

4. The amplifier system of claim 1, wherein the auxiliary driver is farther configured to:

operate as an open circuit if the auxiliary driver is operating at the second gain to allow the primary feedback loop to operate on the input signal to introduce the modulated signal to the output device; and allow the auxiliary feedback loop to operate on the input signal if the auxiliary driver is operating at the first gain to divert the modulated signal away from the output device, thereby preventing the plurality of transient signals coupled to the modulated signal from reaching the output device.

5. The amplifier system of claim 4, wherein the auxiliary driver is further configured to operate at the first gain if a power driver is operating at the second gain, and wherein the power driver is further configured to operate at the first gain if the auxiliary driver is operating at the second gain.

6. The amplifier system of claim 5, wherein the auxiliary driver is further configured to transition from the second gain to the first gain or from the first gain to the second gain based on a smooth ramp function.

7. The amplifier system of claim 6, wherein the power driver is further configured to transition from the second gain to the first gain or from the first gain to the second gain based on the smooth ramp function.

8. The amplifier system of claim 7, wherein the first gain and the second gain are programmable.

9. The amplifier system of claim 5, wherein the auxiliary driver is further configured to ramp up to the first gain as the power driver is ramping down to the second gain, and wherein the power driver is further configured to ramp up to the first gain as the auxiliary driver is ramping down to the second gain.

10. The amplifier system of claim 9, wherein the modulated signal increases as the auxiliary driver is ramping down to the second gain and the power driver is ramping up to the first gain.

11. The amplifier system of claim 10, wherein an output signal provided by the output device increases as the modulated signal increases, and wherein the output signal decreases as the modulated signal decreases.

12. The amplifier system of claim 1, wherein the amplifier system is further configured to transition from the power-up mode to the normal mode if a plurality of common components shared by the auxiliary feedback loop and the primary feedback loop are settled.

13. The amplifier system of claim 1, wherein the amplifier system is further configured to transition from the normal mode to the power-down mode if a plurality of common components shared by the auxiliary feedback loop and the primary feedback loop are settled.

14. A Class-D amplifier arrangement, comprising:

an auxiliary feedback loop configured to operate upon an input signal if the Class-D amplifier arrangement is operating under a power-up condition or a power-down condition wherein a modulated signal is confined within the auxiliary feedback loop during the power-up condition or the power-down condition so that a plurality of transient signals coupled on the modulated signal are diverted away from an output device, and wherein the auxiliary feedback loop comprises:

an auxiliary driver, wherein the auxiliary driver is configured to:

operate at a maximized gain when the Class-D amplifier arrangement is operating under the power-up condition or the power-down condition, and operate at a minimized gain when the Class-D amplifier arrangement is operating under a normal condition; and a primary feedback loop configured to operate upon the input signal if the Class-D amplifier arrangement is operating under the normal condition, wherein the modulated signal is introduced to the output device during the normal condition.

15. A method for preventing a plurality of transient signals that couple onto a modulated signal from being introduced to an output device, comprising:

operating upon an input signal, using an auxiliary driver of an auxiliary feedback loop of an amplifier system, wherein the auxiliary driver operates at a first if the amplifier system is operating, under power-up condition or a power-down condition, wherein the auxiliary driver operates at a second gain if the amplifier system is operating under a normal condition, and wherein the second gain is lower than the first gain;

confining the modulated signal to the auxiliary feedback loop during the power-up condition or the power-down condition;

diverting the plurality of transient signals coupled onto the modulated signal away from the output device during the power-up condition or the power-down condition;

operating upon the input signal with a primary feedback loop during the normal condition; and introducing the modulated signal to the output device during the normal condition.

16. The method of claim 15, wherein operating, upon the input signal with the auxiliary feedback loop further comprises:

introducing the input signal to the auxiliary feedback loop if the auxiliary driver included in the auxiliary feedback loop is operating at the first gain; and removing the input signal from the primary feedback loop if a power driver included in the primary feedback loop is operating at the second gain.

17. The method of claim 15, wherein operating upon the input signal with the primary feedback loop further comprises:

introducing the input signal to the primary feedback loop when a power driver included in the primary feedback loop is operating at the first gain; and removing the input signal from the auxiliary feedback loop when the auxiliary driver included in the auxiliary feedback loop is operating at the second gain.

18. The method of claim 17, further comprising:

transitioning from the power-up condition to the normal condition based on the auxiliary driver transitioning from the first gain to the second gain based on a smooth ramp function and the power driver transitioning from the second gain to the first gain based on the smooth ramp function; and transitioning from the normal condition to the power-down condition based on the power driver transitioning from the first gain to the second gain based on the smooth ramp function and the auxiliary driver transitioning from the second gain to the first gain based on the smooth ramp function.

19. The method of claim 18, further comprising:
ramping down the auxiliary driver to the second gain as the power driver is ramping up to the first gain when transitioning into the normal condition; and
ramping up the auxiliary driver to the first gain as the power driver is ramping down to the second gain when transitioning into the power-down condition.

20. The method of claim 19, further comprising:
transitioning from the power-up condition to the normal condition if a plurality of common components shared by the auxiliary feedback loop and the primary feedback loop are settled; and
transitioning from the normal condition to the power-down condition if the plurality of common components are settled.

* * * * *

UNITED STATES PATENT AND TRADEMARK OFFICE
CERTIFICATE OF CORRECTION

PATENT NO. : 8,686,789 B2
APPLICATION NO. : 13/329699
DATED : April 1, 2014
INVENTOR(S) : Jiang et al.

Page 1 of 1

It is certified that error appears in the above-identified patent and that said Letters Patent is hereby corrected as shown below:

In the Claims

Column 10, line 21, please replace "at a first if" with --at a first gain if--.

Column 10, line 22, please replace "is operating, under" with --is operating under--.

Column 10, line 37, please replace "operating, upon the" with --operating upon the--.

Signed and Sealed this
Seventh Day of April, 2015

Michelle K. Lee
*Director of the United States Patent and Trademark Office*